US012353953B2

(12) United States Patent
Martinis et al.

(10) Patent No.: US 12,353,953 B2
(45) Date of Patent: Jul. 8, 2025

(54) FILTER FOR LAMINATED CIRCUIT ASSEMBLY

(71) Applicant: Google LLC, Mountain View, CA (US)

(72) Inventors: John Martinis, Santa Barbara, CA (US); Bob Benjamin Buckley, Santa Barbara, CA (US); Xiaojun Trent Huang, Santa Barbara, CA (US)

(73) Assignee: GOOGLE LLC, Mountain View, CA (US)

(*) Notice: Subject to any disclaimer, the term of this patent is extended or adjusted under 35 U.S.C. 154(b) by 848 days.

(21) Appl. No.: 17/476,606

(22) Filed: Sep. 16, 2021

(65) Prior Publication Data

US 2022/0083891 A1 Mar. 17, 2022

Related U.S. Application Data

(60) Provisional application No. 63/079,258, filed on Sep. 16, 2020.

(51) Int. Cl.
*G06N 10/00* (2022.01)
*G02B 5/20* (2006.01)

(52) U.S. Cl.
CPC ............. *G06N 10/00* (2019.01); *G02B 5/207* (2013.01); *G02B 5/208* (2013.01)

(58) Field of Classification Search
CPC ......... G06N 10/00; G02B 5/207; G02B 5/208
USPC ....................................................... 359/359
See application file for complete search history.

(56) References Cited

U.S. PATENT DOCUMENTS

| 11,621,466 B2 | 4/2023 | Olivadese et al. |
| 2008/0284545 A1 | 11/2008 | Keefe et al. |
| 2014/0266513 A1* | 9/2014 | Abraham ............. H01P 3/06 |
| | | 29/601 |

FOREIGN PATENT DOCUMENTS

| JP | H04373202 | 12/1992 |
| JP | H05299708 A | 11/1993 |
| JP | H05304224 A | 11/1993 |
| JP | H06523621 A | 2/1994 |
| JP | H09139605 | 5/1997 |
| JP | H10190316 | 7/1998 |

(Continued)

OTHER PUBLICATIONS

International Preliminary Report on Patentability for Application No. PCT/US2021/050631, mailed Mar. 30, 2023, 13 pages.

(Continued)

*Primary Examiner* — Wyatt A Stoffa
*Assistant Examiner* — Grant A Gagnon
(74) *Attorney, Agent, or Firm* — DORITY & MANNING P.A.

(57) ABSTRACT

A laminated circuit assembly for filtering signals in one or more signal lines in, for instance, a quantum computing system is provided. In one example, the laminated circuit assembly includes one or more signal lines disposed within a substrate in a first direction. The laminated circuit assembly includes a dielectric portion of the substrate. The laminated circuit assembly includes a filter portion of the substrate extending in a first direction and containing a frequency absorbent material providing less attenuation to a first signal of a first frequency than to a second signal of a second, higher frequency. The filter portion is configured to attenuate infrared signals passing through the one or more signal lines.

19 Claims, 11 Drawing Sheets

(56) References Cited

FOREIGN PATENT DOCUMENTS

JP           2008/280464       11/2008
WO    WO 2020/139407        7/2020

OTHER PUBLICATIONS

International Search Report and Written Opinion for Application No. PCT/US2021/050631, mailed Dec. 20, 2021, 19 pages.
Chow et al., "Pressure Contact Micro-Springs in Small Pitch Flip-Chip Packages", IEEE Transactions on Components and Packaging Technologies, vol. 29, No. 4, pp. 796-803.
Halpern et al., "Far infrared transmission of dielectrics at cryogenic and room temperatures: glass, Fluorogold, Eccosorb, Stycast, and various plastics", Applied Optics, vol. 25, No. 4, pp. 565-570.
Laird.com, "Flexible Foam Sheet Broadband Microwave Absorber", https://www.laird.com/sites/default/files/2021-01/RFP-DS-AN%2006242020.pdf, retrieved on Jan. 19, 2022, 2 pages.
Shubin et al., "Novel Packaging with Rematable Spring Interconnect Chips for MCM", 59$^{th}$ Electronic Components and Technology Conference, May 26-29, 2009, San Diego, California, 7 pages.

\* cited by examiner

FILTER FOR LAMINATED CIRCUIT ASSEMBLY

PRIORITY CLAIM

The present application claims the benefit of priority of U.S. Provisional Application Ser. No. 63/079,258, filed on Sep. 16, 2020, titled Filter for Laminated Circuit Assembly, which is incorporated herein by reference.

FIELD

The present disclosure relates generally to laminated circuit assemblies. More particularly, aspects of the present disclosure relate to filters for laminated circuit assemblies.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as $a|0\rangle + b|1\rangle$. The "0" and "1" states of a digital computer are analogous to the $|0\rangle$ and $|1\rangle$ basis states, respectively, of a qubit.

SUMMARY

Aspects and advantages of embodiments of the present disclosure will be set forth in part in the following description, or can be learned from the description, or can be learned through practice of the embodiments.

One example aspect of the present disclosure is directed to a laminated circuit assembly. The laminated circuit assembly includes one or more signal lines disposed within a substrate in a first direction. The laminated circuit assembly includes a dielectric portion of the substrate. The laminated circuit assembly includes a filter portion of the substrate extending in a first direction and containing a frequency absorbent material providing less attenuation to a first signal of a first frequency than to a second signal of a second, higher frequency. The filter portion is configured to attenuate infrared signals passing through the one or more signal lines.

Another example aspect of the present disclosure is directed to a method for manufacturing a filter for a signal line. The method includes receiving a laminated circuit assembly having one or more signal lines disposed in a first direction within a dielectric material of a substrate, wherein a second direction is normal to the substrate and a third direction is orthogonal to the first direction and the second direction. The method includes forming a cavity within the substrate by removing a portion of the dielectric material above the signal line in the second direction, the cavity extending in the first direction along the signal line. The method includes filling the cavity with a frequency absorbent material. The frequency absorbent material provides less attenuation to a first signal of a first frequency than to a second signal of a second, higher frequency. The filled cavity is configured to attenuate infrared signals passing through the one or more signal lines.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

DETAILED DESCRIPTION

Figure 1:
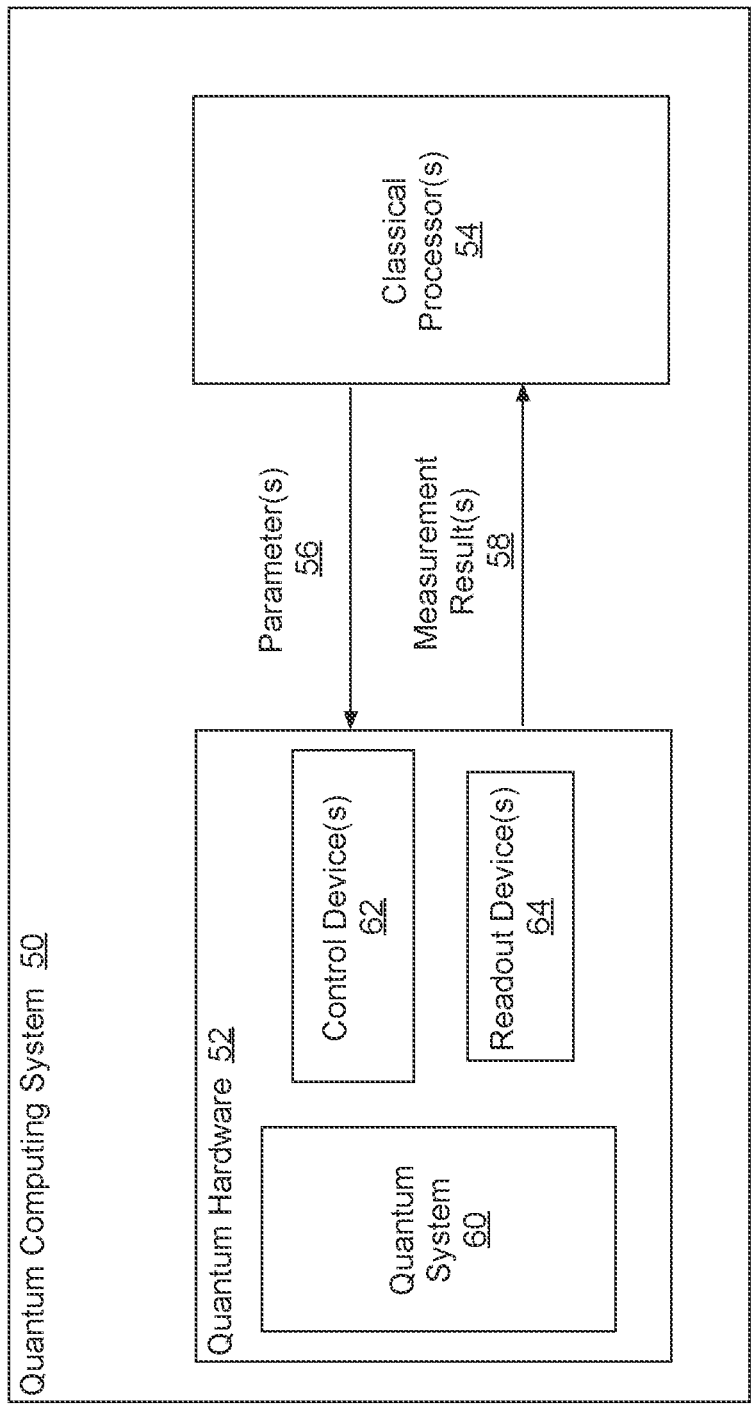
FIG. 1 depicts an example quantum computing system according to example embodiments of the present disclosure.

Example aspects of the present disclosure are directed to a laminated circuit assembly. The circuit assembly can include a signal line disposed along a substrate. The substrate can include a filter portion that provides attenuation to signals traveling along the signal line. In some embodiments, the filter portion can provide different levels of attenuation based on the frequency of the signal on the signal line. For instance, the filter portion can include an absorptive material configured to provide less attenuation to a signal of a first frequency than to a second signal of a second, higher frequency. In one embodiment, the filter portion can attenuate signals in an infrared frequency range.

More particularly, embodiments of a laminated circuit assembly according to example aspects of the present disclosure can include a signal line of any suitable conductive material(s), (e.g., copper, etc.). In some embodiments, the signal line can include a superconducting material, such as a material that is characterized by superconductive properties at or below about 10 Kelvin (including example temperatures below about 1 Kelvin and/or about 20 milliKelvin). For instance, in one embodiment, the signal line can include niobium. In some embodiments, a signal line may include one or more superconductive materials in addition to another conductive material, such as copper or tin. For instance, a superconductive material may be coated, covered, and/or otherwise layered with another conductive material (e.g., deposited and/or electroplated copper, etc.) to protect the superconductive material, strengthen and/or stiffen the superconductive material portion, and/or otherwise cooperate to form a signal line.

Embodiments of a substrate according to example aspects of the present disclosure can include a dielectric material. For instance, the dielectric material can include one or more polymers, one or more ceramics, or composites thereof (e.g., a polymeric matrix with one or more ceramic fillers). In some embodiments, the dielectric material can be rigid or substantially rigid. In some embodiments, the dielectric material can include a resilient material (e.g., a flexible material). For instance, one embodiment of a laminated circuit assembly includes a flex circuit board.

As used herein, a "flex circuit board" refers to a board including at least one generally planar substrate (e.g., layered substrates) or other support on which the one or more signal lines are formed or otherwise disposed and having flexibility in at least one plane. As used herein, "flexibility" refers to a capability of deforming (e.g., subject to mechanical stress, etc.) without breaking. For example, a rectangular flex circuit board may be flexible along a largest surface of the rectangular flex circuit board. A rectangular flex circuit board may be flexible and/or rigid along at least a portion of its edges. The flexibility may be achieved as a property of material(s) from which the flex circuit board and/or layers of the flex circuit board is/are formed (e.g., metals, such as copper, copper alloys, niobium, aluminum, etc., dielectric materials, nonmetals, polymers, rubbers, etc.), achieved by hinging and/or segmenting of the flex circuit board (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

In some embodiments, one or more layers of dielectric material can be laminated together to sandwich one or more signal lines therebetween to form the substrate with the signal line(s) embedded therein. However, in general, it is contemplated that the signal line(s) can be disposed along one or more surfaces of a substrate (e.g., an exterior surface, such as in a microstrip implementation) and/or within the substrate according to any suitable construction method.

Embodiments of a substrate according to example aspects of the present disclosure can include a filter material. In some embodiments, a filter material can be distributed and/or embedded within the dielectric material. For instance, a polymeric dielectric material can be doped with a filter material (e.g., magnetically loaded with frequency absorbing particles). In this manner, the dielectric portion of the substrate and the filter portion of the substrate coincide, as the dielectric portion can be a portion that provides filtering effects.

In some embodiments, however, a filter portion can include different material(s) than some other portions of the substrate, such as the dielectric portion. For instance, a filter portion of the substrate can include a portion of dielectric material (e.g., optionally the same dielectric material) that includes a greater concentration of frequency absorbing components (e.g., frequency absorbing particles) than another portion of the same or different dielectric material (e.g., which may contain none). It is contemplated that, for instance, additive manufacturing techniques may be applied to selectively position material comprising absorptive components within a larger portion of material not otherwise comprising the absorptive components.

In some examples, the filter material can provide less attenuation to signals of a first frequency and greater attenuation to signals of a second, higher frequency. For instance, some filter materials provide attenuation that increases in a substantially monotonic fashion with increasing signal frequency for at least a portion of a targeted frequency band. In some embodiments, aspects of the filter material can be configured for lowpass and/or bandpass operation.

In some embodiments, the filter portion of the substrate can be bounded by one or more boundaries of a cavity within the substrate (e.g., a cavity within the dielectric material). For instance, a cavity within the substrate can be filled with a filter material (e.g., a magnetically loaded polymer). In some embodiments, the cavity can be filled (e.g., partially or completely) with filter material via an access within the substrate when the filter material is in any pourable, injectable, and/or moldable state (e.g., flowing particulates, soft/plasticized materials, gels, slurries, pastes, foams, uncured thermosets, softened/melted thermoplastics, etc.). In some embodiments, the cavity can be filled with the filter material in a substantially solid state (e.g., by press-fitting into the cavity, etc.).

In some embodiments, the cavity can radially surround or otherwise encompass at least one portion of the signal line. For instance, the signal line can extend in a first direction in the substrate. A second direction can be defined in a direction normal to an outer surface of the substrate (e.g., in the direction of a thickness of the substrate). A third direction can be defined orthogonal to the first and second directions. In general, the dimensions of the cavity in the first, second, and third directions can be configured to cause the desired filtration of the signals on the signal line when the cavity is filled with a filtering material. For instance, in one embodiment, the length of the cavity in the first direction can be extended to increase the attenuation of the filter for a given signal frequency. For instance, in one embodiment, a filter material can provide linearly increasing attenuation having a slope of at least about 0.5 dB/GHz. In addition to a length extending in the first direction, the cavity can extend above the signal line in the second direction and/or beside the signal line in the third direction.

In some embodiments, one or more conductors may be laminated to the substrate. For instance, a planar conductor may be laminated to one surface of the substrate, and, in some embodiments, another planar conductor may be laminated to an opposing surface of the substrate. For example, a substrate, a signal line, and one or more planar conductors can be arranged into a microstrip or stripline configuration. In some embodiments, a conductor can be applied over one or more accesses in the substrate used to fill a cavity with filter material. For instance, a planar conductor can be laminated over the access(es), optionally overlapping one or more other planar conductors. In some embodiments, a conductive material can be sprayed, spread, deposited, and/or otherwise applied over the access(es). For instance, conductive material(s) can include a curable nonmetallic matrix that is applied in an uncured state.

Example aspects of the present disclosure are also directed to methods for manufacturing a laminated circuit assembly. For instance, a laminated circuit assembly including one or more signal lines disposed in a first direction within a dielectric material of a substrate can be received or otherwise selected for processing. In one embodiment, a cavity can be formed within the substrate. For instance, the cavity can be formed by removing a portion of the dielectric material within the substrate. Material can be removed in any suitable fashion, including ablation, abrasion, cutting, and the like. Once formed, the cavity can be filled with a frequency absorbent material. In some embodiments, the cavity can be filled with the frequency absorbent material while the dielectric material (e.g., polymer) is in an uncured state.

For example, the frequency absorbent material can provide less attenuation to a first signal of a first frequency than to a second signal of a second, higher frequency (e.g., as described herein). In some embodiments, the filled cavity may be configured to attenuate infrared signals passing through the one or more signal lines.

In some embodiments, a first signal line can have a first filter portion corresponding thereto; and a second adjacent signal line can have a second filter portion corresponding thereto. The first filter portion and the second filter portion are offset from each other in a first direction.

Example aspects of the present disclosure are also directed to cryostats including the circuit assemblies described herein. For instance, a cryostat can include one or more cooling stages for cooling one or more components of a computing system. In one embodiment, a stage can be configured to cool a portion of the computing system to about 20 milliKelvin or less. One or more signal lines coupling a control unit to the cooled portion of the computing system can be part of a circuit assembly as disclosed herein, comprising a filter portion as disclosed herein.

Aspects of the present disclosure provide a number of technical effects and benefits. For instance, circuit assemblies, systems, and methods according to aspects of the present disclosure provide improved communication of sensitive signals. For instance, in some embodiments, a plurality of signals (e.g., control and/or other interfacing signals) are communicated on a signal line of a circuit assembly according to the present disclosure. For example, a first signal can have a first frequency less than about 500 MHz and a second signal can have a second frequency greater than about 2 GHz and less than about 8 GHz. The circuit assemblies according to example embodiments of the present disclosure can be configured to contain frequency absorbent material providing greater attenuation to the second signal than to the first signal. In this manner, the attenuation applied to each set of interfacing signals can be configured for the desired operational characteristics. Of further advantage, circuit assemblies according to example embodiments of the present disclosure can be configured to provide greater attenuation to infrared signals than is provided to either the first signal or the second signal. For instance, in some embodiments, infrared signals can disrupt communication and/or increase thermal loading on connected components.

Of further advantage, circuit assemblies, systems, and methods according to aspects of the present disclosure provide for improved manufacturability. For instance, embodiments of the present disclosure can provide for high-performance circuit assemblies which can be manufactured at a low cost and high yield.

Of further advantage, circuit assemblies, systems, and methods according to aspects of the present disclosure provide for compact and scalable implementations of filtered signal lines. For instance, some implementations are sensitive to signal interference (e.g., qubit interface signals), and prior approaches to filtering and isolating signal lines for qubit interfacing have not provided suitably compact configurations for scaling the number of qubits in a quantum computing system.

With reference again to the FIGS., additional example embodiments of systems and methods the present disclosure will be discussed in further detail. The use of the term "about" in conjunction with a numerical value refers to within 10% of the stated amount.

FIG. 1 depicts an example quantum computing system 50. The example system 50 is an example of a system implemented as a classical or quantum computer program on one or more classical computers or quantum computing devices in one or more locations, in which the systems, components, and techniques described below can be implemented. FIG. 1 depicts an example quantum computing system that can be used to implement aspects of the present disclosure. Those of ordinary skill in the art, using the disclosures provided herein, will understand that other quantum computing structures or systems can be used without deviating from the scope of the present disclosure.

The system 50 includes quantum hardware 52 in data communication with one or more classical processor(s) 54. For instance, quantum hardware 52 can represent and/or manipulate information using qubits. A qubit can be or include any suitable quantum device that enables the superposition of multiple states, (e.g., data in both the "0" and "1" state). As one example, a qubit can be or include a unit of superconducting material, such as superconducting material that achieves superconductivity in temperatures below about 10 mK.

The quantum hardware 52 can include components for performing quantum computation. For example, the quantum hardware 52 can include a quantum system 60, control device(s) 62, and readout device(s) 64 (e.g., readout resonator(s)). The quantum system 60 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 54 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 54 can be configured to, in addition to any other suitable function(s) of the classical processor(s) 54, control the quantum hardware 52. For instance, the classical processor(s) 54 can be coupled to the quantum hardware 52 (e.g., by signal lines)

and/or configured to send control signals to perform quantum operations using the quantum hardware 52. As one example, the classical processor(s) 54 can be configured to send control signals that implement quantum gate operations at the quantum hardware 52 (e.g., by control device(s) 62). Additionally and/or alternatively, the classical processor(s) 54 can be configured to send control signals that cause the quantum hardware 52 to perform quantum state measurements and/or provide the quantum state measurements to the classical processor(s) 54 (e.g., by readout device(s) 64). For example, the classical processor(s) 54 can receive measurements of the quantum system 60 that can be interpretable by the classical processor(s) 54.

The type of multi-level quantum subsystems that the system 50 utilizes may vary. For example, in some cases it may be convenient to include one or more readout device(s) 64 attached to one or more superconducting qubits (e.g., transmon, flux, gmon, xmon, or other qubits).

Quantum circuits may be constructed and applied to the register of qubits included in the quantum system 60 via multiple signal lines that are coupled to one or more control devices 62. Example control devices 62 that operate on the register of qubits can be used to implement quantum logic gates or circuits of quantum logic gates (e.g., Hadamard gates, controlled-NOT (CNOT) gates, controlled-phase gates, T gates, multi-qubit quantum gates, coupler quantum gates, etc). The one or more control devices 62 may be configured to operate on the quantum system 60 through one or more respective control parameters (e.g., one or more physical control parameters). For example, in some implementations, the multi-level quantum subsystems may be superconducting qubits and the control devices 62 may be configured to provide control pulses to control lines (e.g., signal lines 120) to generate magnetic fields to adjust a frequency of the qubits.

The quantum hardware 52 may further include readout devices 64 (e.g., readout resonators). Measurement results 58 obtained via measurement devices may be provided to the classical processors 54 for processing and analyzing. In some implementations, the quantum hardware 52 may include a quantum circuit and the control device(s) 62 and readout devices(s) 64 may implement one or more quantum logic gates that operate on the quantum system 60 through physical control parameters (e.g., microwave pulse) that are sent through wires included in the quantum hardware 52. Further examples of control devices include arbitrary waveform generators, wherein a DAC creates the signal.

The readout device(s) 64 may be configured to perform quantum measurements on the quantum system 60 and send (e.g., by signal lines 120) measurement results 58 to the classical processors 54. In addition, the quantum hardware 52 may be configured to receive data (e.g., by signal lines 120) specifying physical control parameter values 56 from the classical processors 54. The quantum hardware 52 may use the received physical control parameter values 56 to update the action of the control device(s) 62 and readout devices(s) 64 on the quantum system 60. For example, the quantum hardware 52 may receive data specifying new values representing voltage strengths of one or more DACs included in the control devices 62 and may update the action of the DACs on the quantum system 60 accordingly. The classical processors 54 may be configured to initialize the quantum system 60 in an initial quantum state, e.g., by sending data to the quantum hardware 52 specifying an initial set of parameters 56.

The readout device(s) 64 can take advantage of a difference in the impedance for the |0> and |1> states of an element of the quantum system, such as a qubit, to measure the state of the element (e.g., the qubit). For example, the resonance frequency of a readout resonator can take on different values when a qubit is in the state |0> or the state |1>, due to the nonlinearity of the qubit. Therefore, a microwave pulse reflected from the readout device 64 carries an amplitude and phase shift that depend on the qubit state. In some implementations, a Purcell filter can be used in conjunction with the readout device(s) 64 to impede microwave propagation at the qubit frequency.

The system 50 includes control device(s) 62. Control device(s) 62 can operate the quantum hardware 52. For example, control device(s) 62 can include a waveform generator configured to generate control pulses according to example aspects of the present disclosure.

In some implementations, the control device(s) 62 may include a data processing apparatus and associated memory. The memory may include a computer program having instructions that, when executed by the data processing apparatus, cause the data processing apparatus to perform one or more functions described herein.

Figure 2:
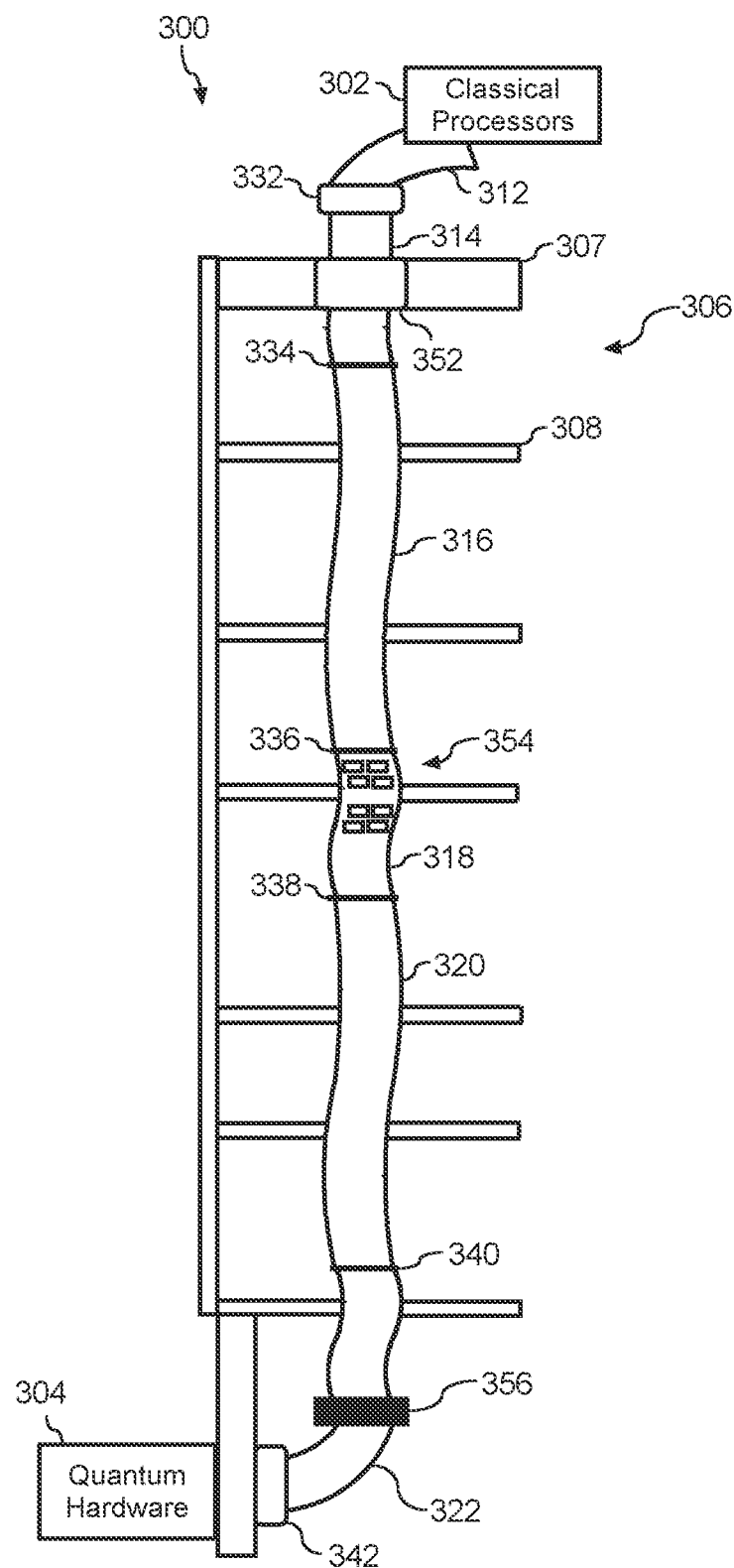
FIG. 2 depicts an example quantum computing system according to example embodiments of the present disclosure.

FIG. 2 depicts an example quantum computing system 300 according to example embodiments of the present disclosure. The quantum computing system 300 can include one or more classical processors 302 and quantum hardware 304 including one or more qubits. The quantum computing system 300 can include a chamber mount 308 configured to support the quantum hardware 304 and a vacuum chamber configured to receive the chamber mount 308 and dispose the quantum hardware 304 in a vacuum. The vacuum chamber can form a cooling gradient from an end of the vacuum chamber (e.g., cap 307) to the quantum hardware 304. For example, the vacuum chamber can form a cooling gradient from a first temperature, such as room temperature (e.g., about 300 Kelvin) to a second temperature, such as at or about absolute zero (e.g., less than about 1 Kelvin), such as to provide a temperature at the quantum hardware 304 at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator.

The quantum computing system 300 can include one or more signal lines between the classical processor(s) 302 and quantum hardware 304. According to example aspects of the present disclosure, the quantum computing system 300 can include one or more flex circuit boards 306 including one or more signal lines. The flex circuit board(s) 306 can be configured to transmit signals by the one or more signal lines through the vacuum chamber to couple the one or more classical processors 302 to the quantum hardware 304. The flex circuit board(s) 306 can include a plurality of signal lines and can provide a significantly improved signal line density, in addition to providing improved isolation, reduced thermal conductivity, and/or improved scalability. For instance, including flex circuit boards 306 according to example aspects of the present disclosure to couple the classical processors 302 to the quantum hardware 304 can provide for infrastructure that reliably scales to the increasingly greater numbers of qubits that are achieved and/or expected in contemporary and/or future quantum computing systems.

In some embodiments, some or all of the flex circuit board(s) 306 can include at least one ground layer. The ground layer can form an outer surface of the flex circuit board 306, such as an outer surface along the largest surface.

In some embodiments, the flex circuit board 306 can include two ground layers, such as two parallel and spaced apart ground layers. For instance, the two ground layers can form both largest outer surfaces of the flex circuit board 306. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s) or reference.

The ground layer(s) can be or can include any suitable electrically conductive material. In some embodiments, the ground layer(s) can be or can include superconducting ground layer(s) including superconducting material(s), such as superconducting material(s) that achieve(s) superconductivity at a temperature less than about 3 Kelvin, such as less than about 1 Kelvin, such as less than about 20 milliKelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, thin superconducting materials, etc.

In some embodiments, the flex circuit board 306 can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board 306 can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at a temperature less than about 3 degrees Kelvin, such as less than about 1 degree Kelvin, such as less than about 20 milliKelvin. As examples, the signal line(s) can be or can include niobium, tin, aluminum, molybdenum disulfide, BSCCO, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, thin superconducting material, etc.

In some embodiments, the flex circuit board 306 can include one or more vias. For instance, the vias can extend through the ground layer(s), the dielectric layer(s), and/or the signal line(s). The vias can serve to improve isolation of the signal lines. Additionally and/or alternatively, the vias can serve to couple multiple ground layers and/or transfer signals between layers of the flex circuit board. In some embodiments, the via(s) can be plated with via plate(s) that extend along the via(s). In some embodiments, the via plate(s) can be or can include conductive material, such as copper.

For instance, in some embodiments, a quantum computing system 300 can include quantum hardware 304 in data communication with one or more classical processor(s) 302. For instance, quantum hardware 304 can represent and/or manipulate information using qubits. A qubit can be or include any suitable quantum device that enables the superposition of multiple states, e.g., both the "0" and "1" state. As one example, a qubit can be or include a unit of superconducting material, such as superconducting material that achieves superconductivity at a temperature of less than about 3 degrees Kelvin, such as less than about 1 degree Kelvin, such as less than about 20 milliKelvin. In some embodiments, the quantum computing system 300 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 302 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 302 can be configured to, in addition to any other suitable function(s) of the classical processor(s) 302, control the quantum hardware 304. For instance, the classical processor(s) 302 can be coupled to the quantum hardware 304 (e.g., by signal lines included in flex circuit boards 306 according to example aspects of the present disclosure) and/or configured to send control signals to perform quantum operations using the quantum hardware 304. As one example, the classical processor(s) 302 can be configured to send control signals that implement quantum gate operations at the quantum hardware 304 (e.g., by control device(s)). Additionally and/or alternatively, the classical processor(s) 302 can be configured to send control signals that cause the quantum hardware 304 to perform quantum state measurements and/or provide the quantum state measurements to the classical processor(s) 302 (e.g., by readout device(s)). For example, the classical processor(s) 302 can receive measurements of the quantum system that can be interpretable by the classical processor(s) 302.

According to example aspects of the present disclosure, the quantum computing system 300 can include one or more flex circuit boards 306 including one or more signal lines. The classical processor(s) 302 can be coupled to at least one first flex circuit board. For instance, the classical processor(s) 302 can be coupled to the first flex circuit board(s) 314 by a classical-flex interconnect 332. The classical-flex interconnect 332 can convert from a classical signal transmission medium (e.g., a coaxial cable) 312 to the first flex circuit board(s) 314.

As one example, the classical-flex interconnect 332 can be or can include a compression interposer. The compression interposer can include an array (e.g., a two-dimensional array) of spring pads. A connector receiving signals from the classical processor(s) 302, such as via one or more coaxial cables 312 (e.g., one coaxial cable 312 per signal line) can be compressed against the compression interposer to form signal communications between the spring pads and the connector (e.g., the coaxial cables). The spring pads can each be coupled to a signal line on the first flex circuit board 314 such that signals can be transmitted from the classical processor(s) 302 (e.g., the coaxial cables) to the signal lines. The compression interposer can provide for connecting signal transmission media 312 having a relatively lower spatial density, such as coaxial cables, which may occupy a relatively larger amount of space per cable, to signal transmission media having a relatively higher spatial density, such as signal lines embedded in a first flex circuit board 314 provided according to example aspects of the present disclosure. Additionally, the compression interposer can achieve high isolation between signal lines and/or low reflectivity along a signal line that is/are suitable for quantum computing applications.

In some embodiments, the first flex circuit board(s) 314 can be or can include a first flex circuit board material at the ground layer(s) and/or the signal line(s). The first flex circuit board material can be selected to provide high signal transfer performance characteristics. As examples, the first flex circuit board material can be or can include copper, brass, gold, and/or other suitable materials having high signal transfer performance characteristics. For instance, the first flex circuit board(s) 314 can include copper signal lines and/or ground layer(s) to provide high signal transfer performance characteristics.

The first flex circuit board(s) 314 can pass through a hermetic seal 352 positioned at an end (e.g., an entrance) of the vacuum chamber, such as cap 307. For example, a flex circuit board (e.g., first flex circuit board 314) can be configured to pass through the hermetic seal 352 such that a first portion of the flex circuit board (e.g., first flex circuit board 314) is disposed in the vacuum chamber and a second portion of the flex circuit board (e.g., first flex circuit board 314) is disposed outside of the vacuum chamber while the hermetic seal 352 forms a vacuum seal for the vacuum chamber. The hermetic seal 352 can provide for the first flex circuit board(s) 314 to enter the vacuum chamber without (e.g., substantially) destroying a vacuum created by the vacuum chamber. As one example, the hermetic seal 352 can include a fitted seal for each first flex circuit board 314. The fitted seal(s) can receive the first flex circuit board(s) 314 and form a vacuum seal with surface(s) of the first flex circuit board(s) 314. Additionally, the hermetic seal 352 can include one or more seal slots configured to receive the fitted seal(s) and/or the first flex circuit board(s) 314. For example, the fitted seal(s) can form a vacuum seal with the seal slot(s) while allowing the first flex circuit board(s) 314 to pass through the seal slot(s) and into the vacuum chamber. In this way, the flex circuit board(s) 306 can enter the vacuum chamber without experiencing signal disruptions from breaks in the circuit boards, as the boards can continuously pass into the vacuum chamber. In some embodiments, the hermetic seal 352 can include fastening systems to secure the fitted seals to the seal slots and/or form a vacuum seal, such as, for example, screws, bolts, seal rings, O rings, etc.

In some embodiments, the hermetic seal 352 can form a vacuum seal without requiring adhesive material (e.g., glue, resin, etc.) such that, for example, residual adhesive material does not contaminate the flex circuit boards 306.

The first flex circuit board(s) 314 can be coupled to at least one second flex circuit board(s) 316. The first flex circuit board(s) 314 can be coupled to the second flex circuit board(s) 316 by at least one flex-flex interconnect 334. For instance, the flex-flex interconnect(s) 334 can couple (structurally and/or electrically) the ground layer(s), dielectric layer(s), and/or signal line(s) of a first flex circuit board 314 to a second flex circuit board 316. As examples, the flex-flex interconnect(s) 334 can be formed by soldering, welding, and/or otherwise fusing components of a first flex circuit board 314 to a second flex circuit board 316. The flex-flex interconnect(s) 334 can be or can include any suitable interconnection of two flex circuit board(s) 306 such as, for example, a butt joint, an overlap joint, and/or any other suitable interconnection(s).

The second flex circuit board(s) 316 can have at least a different material composition from the first flex circuit board(s) 314. In some embodiments, the second flex circuit board(s) 316 can be or can include a second flex circuit board material at the ground layer(s) and/or the signal line(s). The second flex circuit board material can be selected to provide high signal transfer performance characteristics and/or reduced thermal conductivity. As examples, the second flex circuit board material can be or can include a copper alloy and/or other suitable materials having desirable thermal characteristics. For instance, the second flex circuit board(s) 316 can include copper alloy signal lines and/or ground layer(s) to provide reduced thermal conductivity from the upper portions of the vacuum chamber (e.g., first circuit boards 314) and/or dispelling heat produced at subsequent components, such as surface mount attenuators 354.

In some embodiments, the second flex circuit board(s) 316 can be coupled to at least one surface mount attenuator board 318. For instance, the second flex circuit board(s) 316 can be coupled to the surface mount attenuator board(s) 318 by at least one flex-flex interconnect 336. For instance, the flex-flex interconnect(s) 336 can couple (structurally and/or electrically) the ground layer(s), dielectric layer(s), and/or signal line(s) of a second flex circuit board 316 to a surface mount attenuator board 318. As examples, the flex-flex interconnect(s) 336 can be formed by soldering, welding, and/or otherwise fusing components of a second flex circuit board 316 to a surface mount attenuator board 318. The flex-flex interconnect(s) 336 can be or can include any suitable interconnection of two flex circuit board(s) 306 such as, for example, a butt joint, an overlap joint, and/or any other suitable interconnection(s).

The surface mount attenuator board 318 can be a flexible printed circuit board. In some embodiments, the surface mount attenuator board(s) 318 can be or can include a surface mount attenuator board material at the ground layer(s) and/or the signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board can include copper signal lines and/or ground layer(s) to provide high signal transfer performance characteristics.

The surface mount attenuator board(s) 318 can include one or more surface mount attenuators 354. The surface mount attenuator(s) 354 can be configured to attenuate or block thermal photon interference. In some embodiments, the surface mount attenuator board(s) 318 and/or the surface mount attenuator(s) 354 can be placed at a temperature cold enough such that the surface mount attenuator(s) 354 do not produce thermal photons. In some embodiments, the surface mount attenuator(s) 354 can be disposed in an isolation plate. The isolation plate can be configured to isolate the one or more surface mount attenuators. The isolation plate can be attached to the surface mount attenuator board(s) 318. In some embodiments, the isolate plate can be mounted to a ground layer and/or grounded. The isolation plate can include one or more cavities configured to isolate a first surface mount attenuator from a second surface mount attenuator. For example, the cavities can surround the first surface mount attenuator in a direction of a second surface mount attenuator and block cross-talk between attenuators.

The quantum computing system 300 can include at least one third flex circuit board 320. For instance, the surface mount attenuator board(s) 318 can be coupled to the third flex circuit board(s) 320 by at least one flex-flex interconnect 338. For instance, the flex-flex interconnect(s) 338 can couple (structurally and/or electrically) the ground layer(s), dielectric layer(s), and/or signal line(s) of a surface mount attenuator board 318 to a third flex circuit board 320. As examples, the flex-flex interconnect(s) 338 can be formed by soldering, welding, and/or otherwise fusing components of a surface mount attenuator board 318 to a third flex circuit board 320. The flex-flex interconnect(s) 338 can be or can include any suitable interconnection of two flex circuit board(s) 306 such as, for example, a butt joint, an overlap joint, and/or any other suitable interconnection(s).

The third flex circuit board(s) 320 can be positioned at a point in the vacuum chamber at which the cooling gradient is cool enough such that some materials exhibit superconductivity. For example, at least a portion of the third flex circuit board(s) 320 can have a temperature of less than about 3 degrees Kelvin.

In some embodiments, the third flex circuit board(s) 320 can be or can include a third flex circuit board material at the ground layer(s) and/or the signal line(s). The third flex circuit board(s) 320 material can be selected to be superconducting at a temperature which at least a portion of the third flex circuit board(s) 320 experiences superconductivity. As examples, the third flex circuit board(s) 320 material can be or can include niobium, tin, aluminum, and/or other suitable superconducting materials. For instance, the third flex circuit board(s) 320 can include copper-plated niobium signal lines and/or ground layer(s) to provide superconductivity. For instance, the copper plating on the copper-plated niobium board(s) can be useful in interfacing with the superconducting niobium, which can provide for improved signal transfer characteristics. In some embodiments, the copper-plated niobium board(s) can be formed by first applying a layer of niobium, followed by a thin layer of copper to prevent the formation of oxides, then a thicker layer of copper.

In some embodiments, the third flex circuit board(s) 320 can be coupled to at least one fourth flex circuit board 322. The third flex circuit board(s) 320 can be coupled to the fourth flex circuit board(s) 322 by at least one flex-flex interconnect 340. For instance, the flex-flex interconnect(s) 340 can couple (structurally and/or electrically) the ground layer(s), dielectric layer(s), and/or signal line(s) of a third flex circuit board 320 to a fourth flex circuit board 322. As examples, the flex-flex interconnect(s) 340 can be formed by soldering, welding, and/or otherwise fusing components of a third flex circuit board 320 to a fourth flex circuit board 322. The flex-flex interconnect(s) 340 can be or can include any suitable interconnection of two flex circuit board(s) 306 such as, for example, a butt joint, an overlap joint, and/or any other suitable interconnection(s).

The fourth flex circuit board(s) 322 can couple the third flex circuit board(s) 320 to the quantum hardware 304. For example, a connector 342 at an end of the fourth flex circuit board(s) 322 can attach to a port that is in signal communication with the quantum hardware 304. As one example, the connector can be a T-joint connector, such as a T-joint connector including superconducting materials (e.g., tin). Additionally and/or alternatively, the connector 342 may be a planar spring array.

In some embodiments, the fourth flex circuit board(s) 322 can be or can include a fourth flex circuit board material at the ground layer(s) and/or the signal line(s). The fourth flex circuit board(s) 322 material can be selected to provide high signal transfer performance characteristics. As examples, the fourth flex circuit board(s) 322 material can be or can include copper, brass, gold, and/or other suitable materials having high signal transfer performance characteristics. For instance, the fourth flex circuit board(s) 322 can include copper signal lines and/or ground layer(s) to provide high signal transfer performance characteristics. Additionally and/or alternatively, the fourth flex circuit board(s) 322 material can be selected to be superconducting at temperatures which at least a portion of the fourth flex circuit board(s) 322 experience. As examples, the fourth flex circuit board(s) 322 material can be or can include niobium, tin, aluminum, and/or other suitable superconducting materials.

According to example aspects of the present disclosure, the fourth flex circuit board(s) 322 can be or can include a filter 356, such as an XYZ and/or IR filter 356. The filter 356 can include the laminated circuit assembly according to any of the embodiments described herein. For instance, the filter 356 can be configured to reduce effects of noise, thermal photons, and/or other potential sources of interference. As one example, the filter 356 can include a cavity in the fourth flex circuit board(s) 322 that is filled with a filter material, such as a particulate suspension, to provide XYZ/IR filtering. In some examples, the filter material can provide less attenuation to signals of a first frequency and greater attenuation to signals of a second, higher frequency. For instance, some filter materials provide attenuation that increases in a substantially monotonic fashion with increasing signal frequency for at least a portion of a targeted frequency band. In some embodiments, aspects of the filter material can be configured for lowpass and/or bandpass operation.

Figure 3:
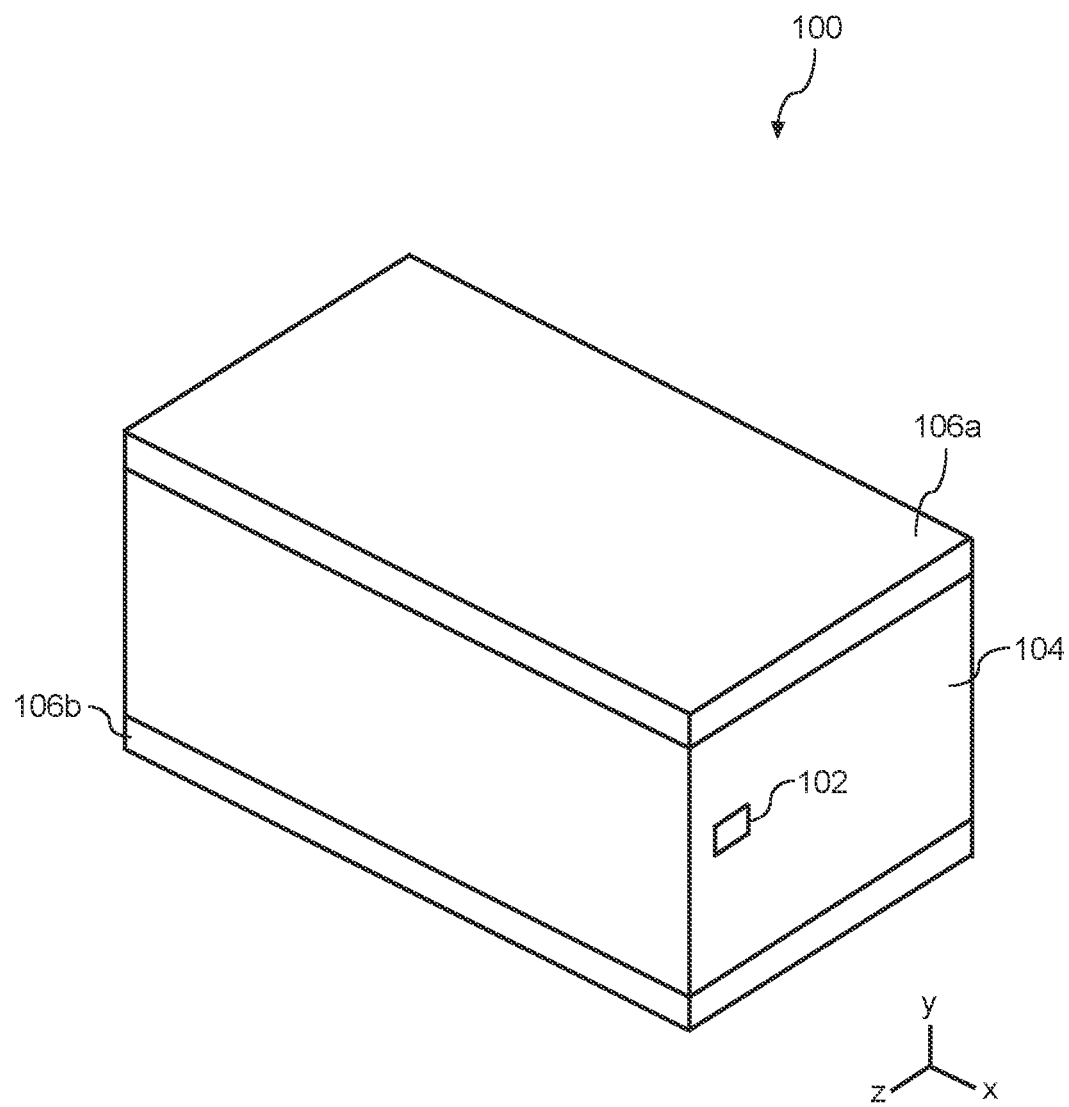
FIG. 3 depicts an isometric cross-sectional view of an example portion of a laminated circuit assembly according to an example embodiment of the present disclosure.

FIG. 3 depicts an example laminated circuit assembly that can be used to implement a filter according to example embodiments of the present disclosure. The laminated circuit assembly 100 comprises a signal line 102 within a substrate 104. In the embodiment depicted, planar conductors 106a and 106b are laminated to the upper and lower surfaces of the substrate 104, respectively, but it is contemplated that any one of planar conductors 106a and 106b could be substituted with other conductor geometries and/or omitted. For instance, the embodiment depicted in FIG. 3 can correspond to a "stripline" configuration, with the signal line 102 comprising a conductive trace running in the x-direction between two parallel planar conductors, but systems and methods of the present disclosure can comprise embodiments with other circuit configurations, including "microstrip" configurations and substantially any configuration of one or more conductors 102 (which can be traces, wires, etc.) and a substrate 104 (e.g., circuit boards generally, such as single layer, double layer, and/or multilayer printed circuit boards).

In some embodiments, the signal line 102 can comprise one or more conductive materials (e.g., copper, gold, silver, aluminum, tin, zinc, niobium, palladium, platinum, titanium, tungsten, vanadium, magnesium, molybdenum, magnesium diboride, etc.) which have been formed into a conductive body, such as a strip or trace. For instance, the signal line 102 can comprise multiple conductive materials in an alloy and/or composite formulation.

In some embodiments, the signal line 102 can comprise a plurality of layers of conductive material(s). In one example, the signal line 102 can comprise at least one layer of a superconducting material (e.g., superconducting at temperatures less than about 3 degrees Kelvin, such as less than about 1 degree Kelvin, such as less than about 20 milliKelvin, such as niobium). In some embodiments, the superconducting material can be layered with another conductor. For instance, a superconducting layer can be deposited on a surface of a substrate, such as by vacuum deposition, and another layer (e.g., a copper layer, a tin layer, etc.) can be deposited onto the surface of the superconducting conductor. In some embodiments, the other layer can be deposited onto the superconducting layer to provide protection to the superconducting layer (e.g., from oxidation). For instance, a first deposition can deposit superconducting material onto a substrate in a vacuum environment, and, without releasing the vacuum, a second deposition can deposit another conductor to shield the superconducting material from the atmosphere. In some embodiments, one or more additional layers of conductive material (e.g., the same or different conductive material) can be plated on top of the deposited layers. For instance, the second deposition can provide a thin protective coating for the superconductor, and a subsequent plating (e.g., electroplating) can provide a thicker conductive layer. In some example aspects, a thicker, plated conductive layer can provide structural support to improve the strength and/or resilience of the superconductive layer(s) of the signal line 102. In some embodiments, one or more of planar conductors 106a and 106b (and any plated vias associated therewith) can be fashioned similarly using one or more deposited layers and one or more plated layers.

In some embodiments, a signal line 102 can be deposited or otherwise laminated on a substrate. In some embodiments, a signal line 102 can be embedded within a substrate. For instance, one or more layers of a polymeric substrate can be fused or otherwise joined, such that any signal lines 102 on a surface of one of the layers can be embedded within the whole substrate. One example is shown in FIG. 3, with signal line 102 embedded within substrate 104 and extending in the x-direction.

In some embodiments, the substrate 104 can comprise one or more polymers. In some implementations, the substrate 104 can comprise a reinforced polymer, such as a fiber-reinforced polymer (e.g., fiberglass). In some embodiments, the substrate 104 can comprise a filled polymer. In some embodiments, the substrate can be loaded with a filler comprising frequency absorbing particles.

In some embodiments, the substrate 104 can comprise a filter portion. For instance, a portion of the substrate 104 can comprise a filter for filtering signals traveling along the signal line 102 (e.g., along a transmission line comprising signal line 102 and/or planar conductors 106a and 106b, if present). The filter portion can comprise a filter material which filters the signals. The filter material can be the same or different than the material for the substrate 104. For instance, in one embodiment, the filter portion comprises a portion of the substrate 104 surrounding and/or adjacent to the signal line 102, and the portion can be loaded with frequency absorbing particles to provide a desired filtering effect to signals on the signal line 102. In some embodiments, the substrate 104 can be loaded with frequency absorbing particles to provide the filtering effect.

In some embodiments, a cavity can be formed within the substrate 104 which can be filled with a filter material different than the substrate 104. For instance, the dielectric portion can be formed of a first polymer. The frequency absorbent material can include frequency absorbing particles embedded within a second polymer (e.g., a curable polymer) that is different than the first polymer. As one example, a cavity can be filled with the curable polymer wen the curable polymer is in an uncured state.

Generally, the cavity can be formed according to any suitable approach. For instance, the cavity can be formed by removal of material within the substrate 104. However, it is also contemplated that the cavity could be formed by the selective omission of substrate 104 in areas in which a filter material is intended to be placed. For example, the substrate 104 could be formed in layers, as noted above, and one or more of the layers could include voids which, when joined with adjacent layers, provides a cavity within the substrate 104 that may be filled with a filter material. In some embodiments, the substrate 104 could be formed using additive manufacturing techniques, and one or more portions of the substrate 104 could selectively not be added during the manufacturing, forming a cavity thereby.

Figure 4:
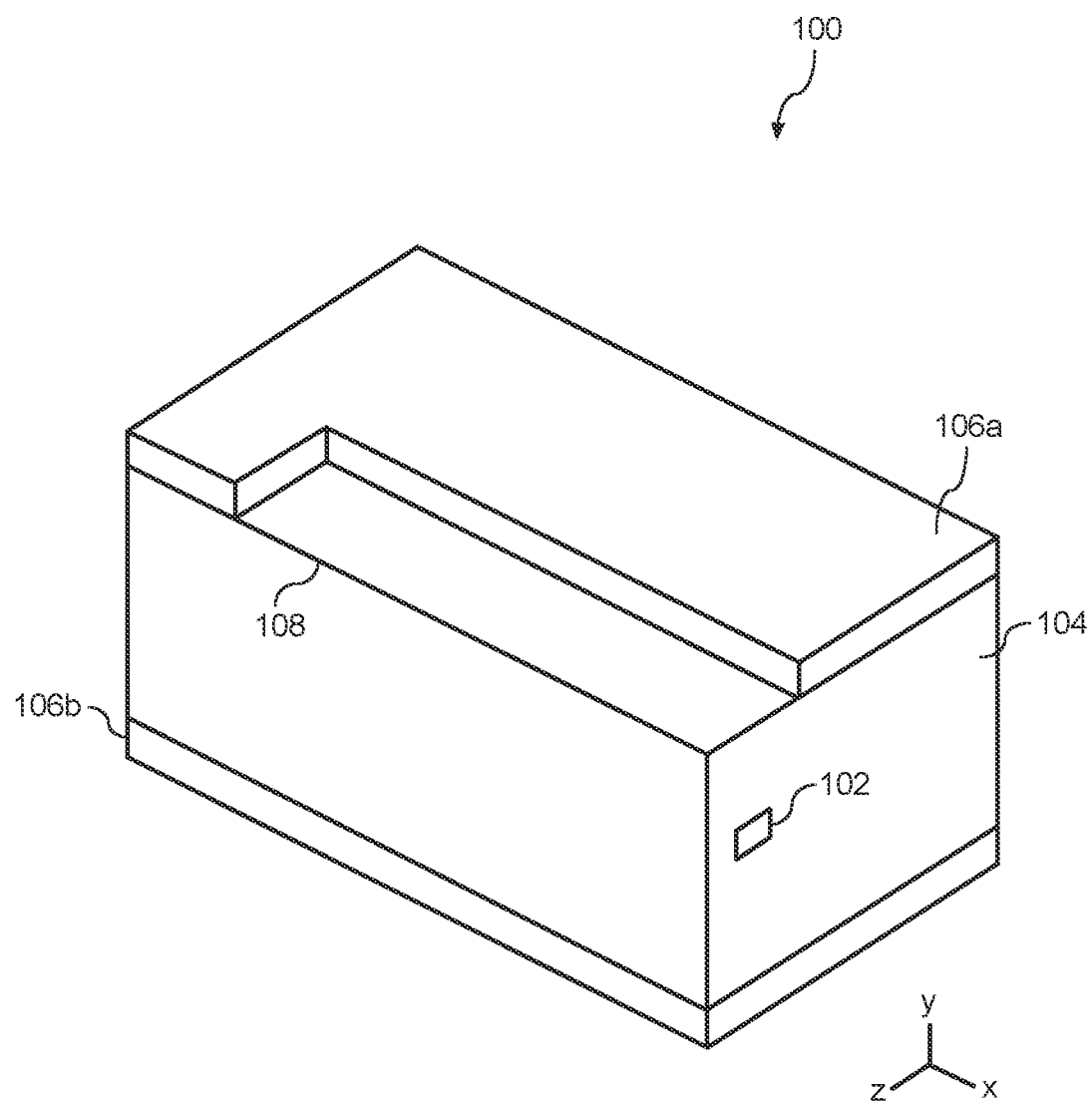
FIG. 4 depicts an isometric cross-sectional view of an example portion of a processed laminated circuit assembly according to an example embodiment of the present disclosure.

In some embodiments, a cavity can be formed in the substrate 104 by processing an existing laminated circuit assembly. For instance, in FIG. 3, a laminated circuit assembly 100 is depicted which can be processed according to example aspects of the present disclosure. In some embodiments, the processing can include removing a portion of one or more layers of material which may be laminated to the substrate 104. For instance, in FIG. 4, the laminated circuit assembly 100 is depicted with a portion of the planar conductor 106a removed, exposing an area 108 of the substrate 104. Although FIG. 4 depicts the area 108 being exposed as rectangular, it is to be understood that the exposed area 108 can assume substantially any form, and, because some embodiments may lack a planar conductor 106a, the exposed area 108 may take substantially the form of the surface of the substrate 104. The exposed area 108 can provide an access for removing material from the substrate 104.

Figure 5:
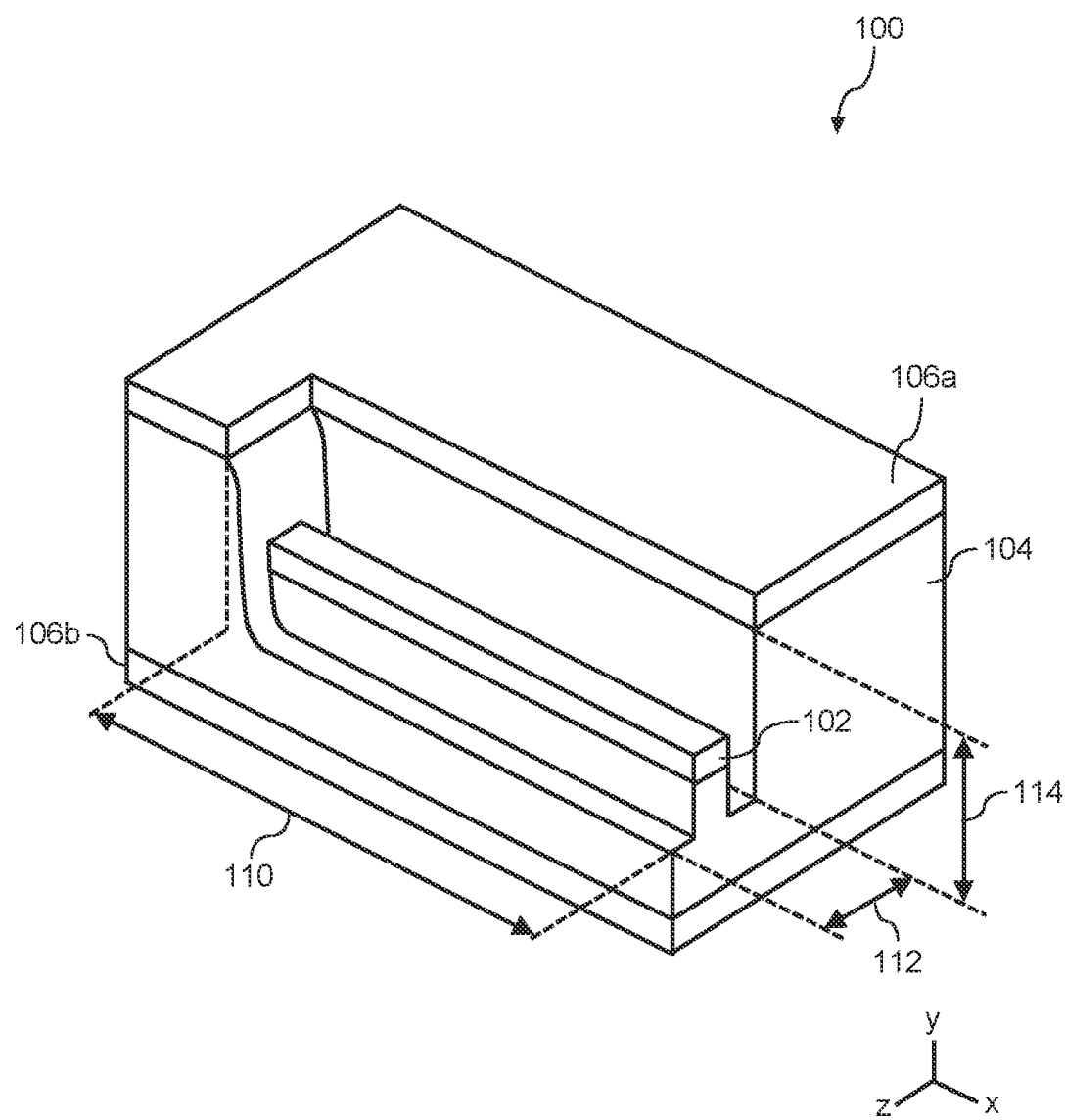
FIG. 5 depicts an isometric cross-sectional view of an example portion of a processed laminated circuit assembly according to an example embodiment of the present disclosure.

In some embodiments, the processing can include removing a portion of the substrate 104 to form a cavity which may be partially or completely filled with a filter material. For instance, FIG. 5 depicts the laminated circuit assembly 100 which has had a portion of the substrate 104 removed along a length 110, width 112, and depth 114.

In some embodiments, portions of the substrate 104 can be removed by cutting, drilling, milling, abrading, or otherwise mechanically removed. In some embodiments, portions of the substrate 104 can be removed by etching or other chemically reactive material removal processes. In some embodiments, portions of the substrate 104 can be removed by ablation to form the cavity (e.g., laser ablation, etc.). For example, as shown in FIG. 5, material may be removed from the substrate 104 from one direction (e.g., from they-direction, as shown). For instance, material from the substrate 104 can be selectively removed from above the signal line 102 in the y-direction and from beside the signal line 102 in the z-direction. In some examples, depending on the material removal method, the composition of the signal line 102 and/or coatings thereon can influence the selective removal of material. For instance, in some embodiments, the material(s) of the signal line 102 may be resistive to the removal process (or, at least more resistive than the surrounding material of the substrate 104). In this manner, a material removal process can be applied over the area covered by the length 110 and the width 112 without masking the area above the signal line 102. For instance, a material of a signal line 102 can be resistive to an ablation process, such that the area covered by length 110 and width 112 can be ablated without masking the area above the signal line 102. In this manner, the speed and throughput of the ablation process(es) can be improved.

Figure 6:
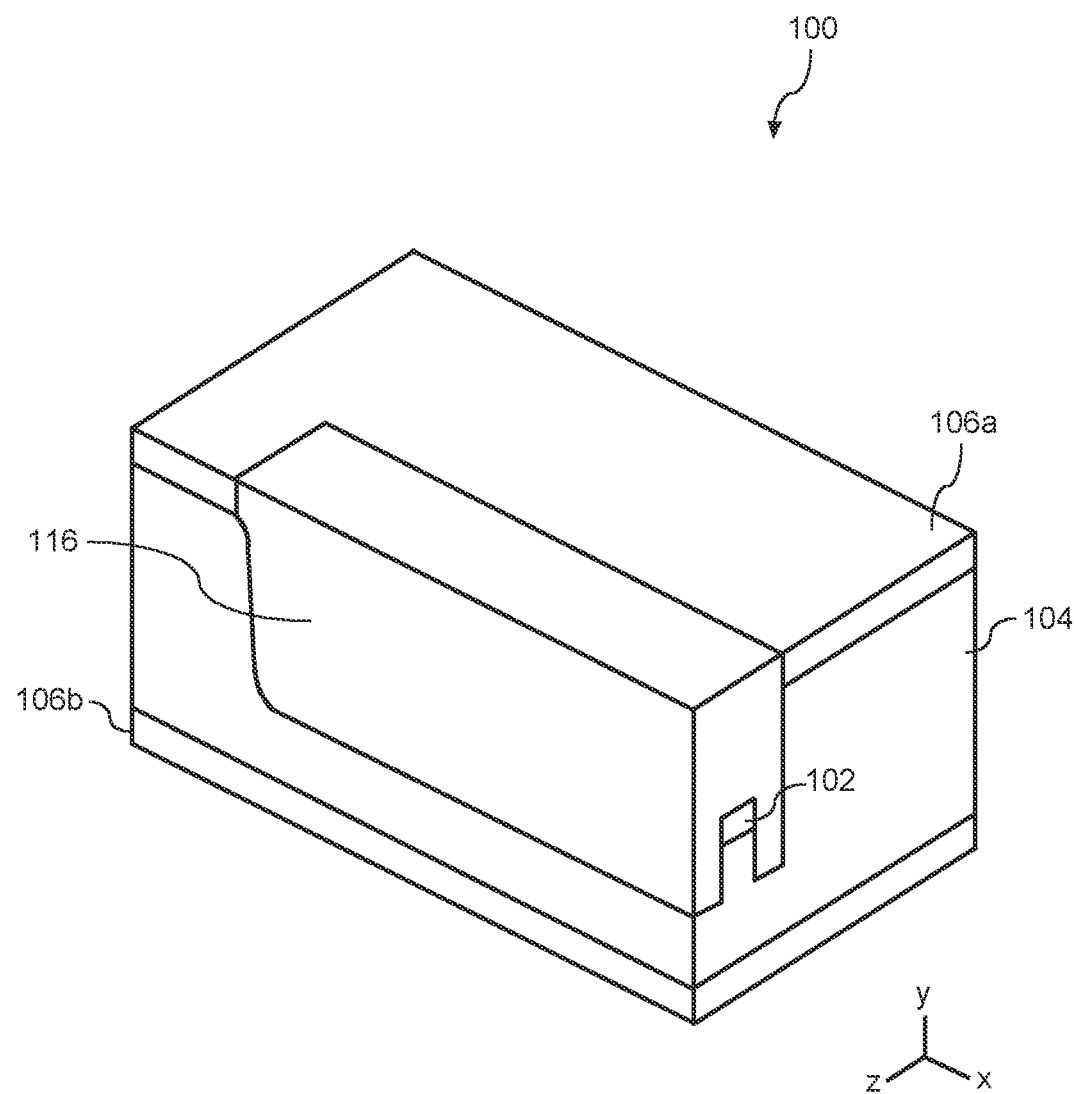
FIG. 6 depicts an isometric cross-sectional view of an example portion of a processed laminated circuit assembly according to an example embodiment of the present disclosure.

After the material of the substrate 104 is removed, the cavity formed thereby can be filled with a filter material to form a filter portion 116 of the substrate 104, as depicted in FIG. 6. The filter portion 116 can be completely filled, as shown in FIG. 1D, or, in some examples, be partially filled. For instance, the filter portion 116 can be filled with a first filter material and a second filter material, each filter material partially filling the cavity. In some embodiments, a filter material can partially fill the cavity (e.g., a portion of the cavity directly surrounding the signal line 102) and another material (e.g., the material of substrate 104) could be filled in the remaining portion of the cavity to encapsulate the filter material. The filter portion 116 can extend to a surface of the substrate 104 and/or extend to the outer surface of a planar conductor laminated to the substrate 104 (e.g., as shown in FIG. 6).

Figure 7:
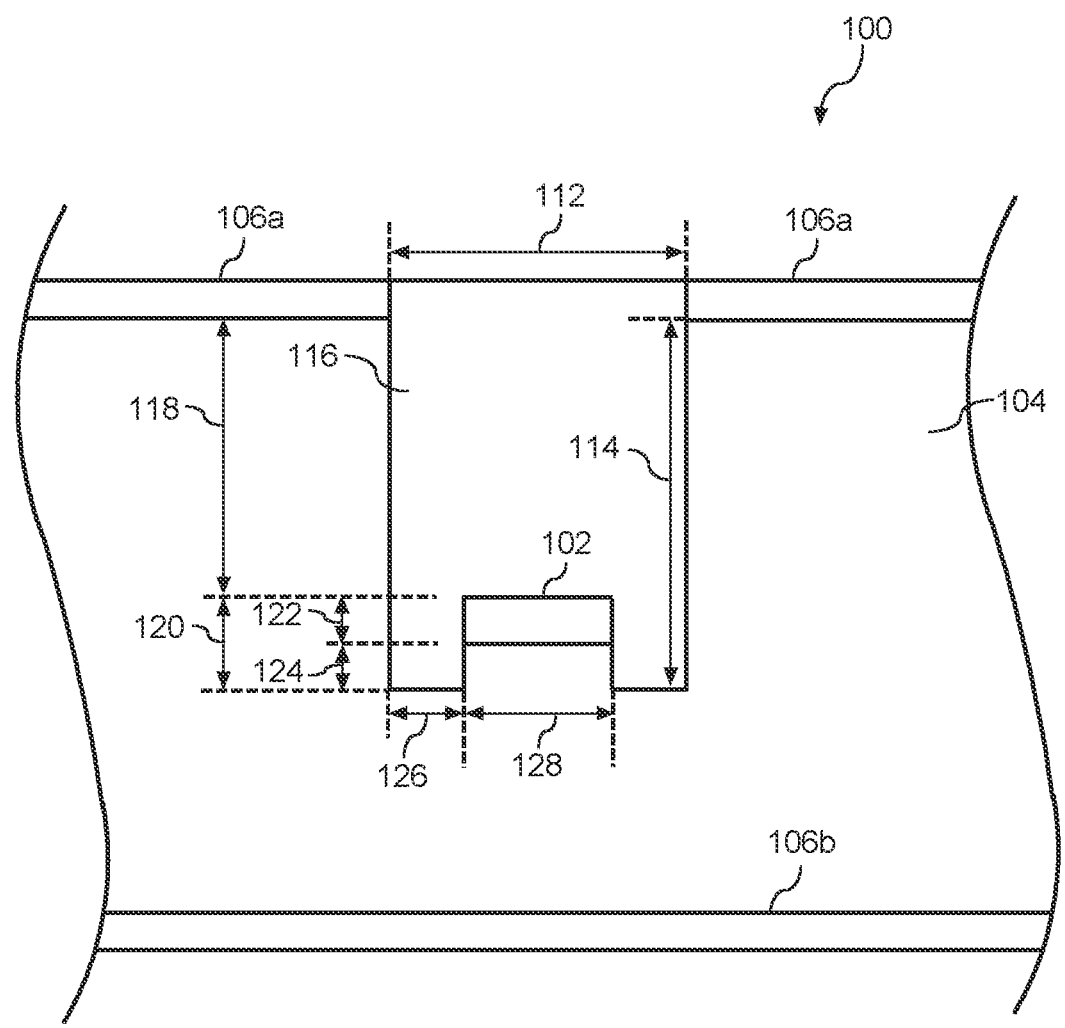
FIG. 7 depicts a cross-sectional view of an example processed laminated circuit assembly according to an example embodiment of the present disclosure.

FIG. 7 depicts a cross-sectional view of the filter portion 116 within the substrate 104. The filter portion 116 can assume substantially any shape defined by one or more boundaries of the cavity formed within the substrate 104. For instance, one boundary may be defined based on the depth 118 of the signal line 102 within the substrate 104. Another boundary may be configured to extend the legs of the filter portion 116 an additional depth 120 to surround the signal line 102, such that the legs can cover the thickness 122 of the signal line 102 plus another distance 124 beyond the thickness 122 of the signal line 102. In this manner, the filter portion 116 can at least partially surround the signal line 102 to provide filtration to one or more signals travelling along the signal line 102. Additionally, the width 112 of the cavity can be configured such that the filter portion 116 can extend a distance 126 on one or both sides of the signal line 102 beyond the width 128 of the signal line 102. In some examples, the filter portion 116 extends at least a distance 126 on both sides of the signal line 102, but can optionally extend a distance longer than distances 126 on one side of the signal line 102 to provide additional filtering and/or shielding on the one side (e.g., to reduce crosstalk and/or other interference from another signal line near that one side).

Although the preceding description has referred to figures which depict a cavity being formed which exposes the signal line 102, it is contemplated that a cavity according to other example aspects of the present disclosure can be formed which does not expose the signal line 102. For instance, it may be desired, in some cases, to form a cavity in one process (e.g., with one set of equipment) and transfer the processed substrate 104 to another system for further processing. In one embodiment, it may be desired that at least some substrate material remain to protect and/or shield the signal line 102 from damage and/or contamination. For example, in some embodiments, the filter material of the filter portion may exert mechanical stresses on the signal line 102 when the filter material is filling the cavity (e.g., during insertion and/or injection, during adhering of the filter material and/or during curing of the filter material, etc.). It may be desirable, in some circumstances, for at least some of the substrate material of the substrate 104 to remain as a support for the signal line.

Figure 8:
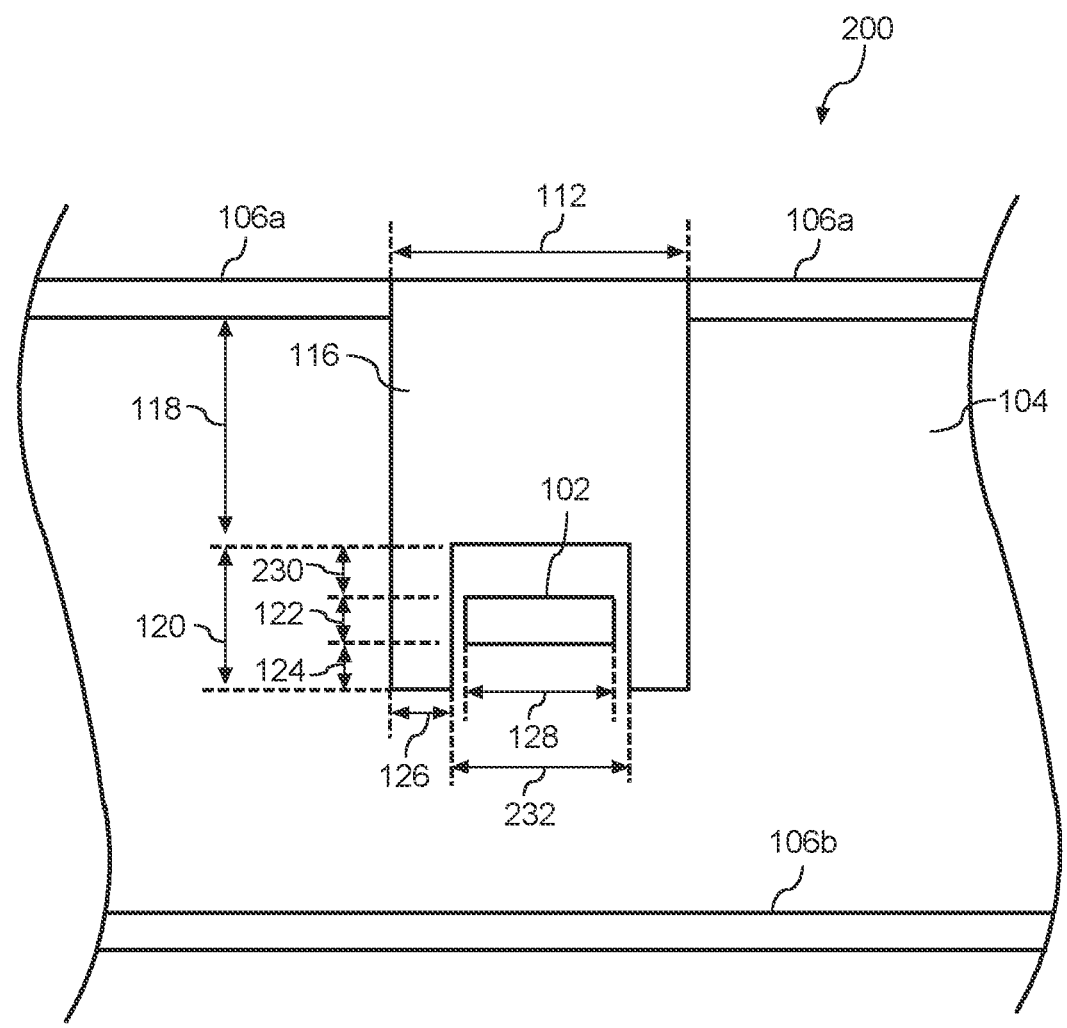
FIG. 8 depicts a cross-sectional view of an example processed laminated circuit assembly according to another example embodiment of the present disclosure.

For example, FIG. 8 depicts a cross-sectional view of a circuit assembly 200 having another profile of a filter portion 116 which does not extend to the signal line 102 but is instead separated a distance 230 from the top of the signal line 102. Similarly, in some embodiments, the legs of the filter portion 116 can be spaced apart a distance 232, which may be greater than the width 128 of the signal line 102, to leave some of the material of substrate 104 surrounding the signal line 102.

Figure 9:
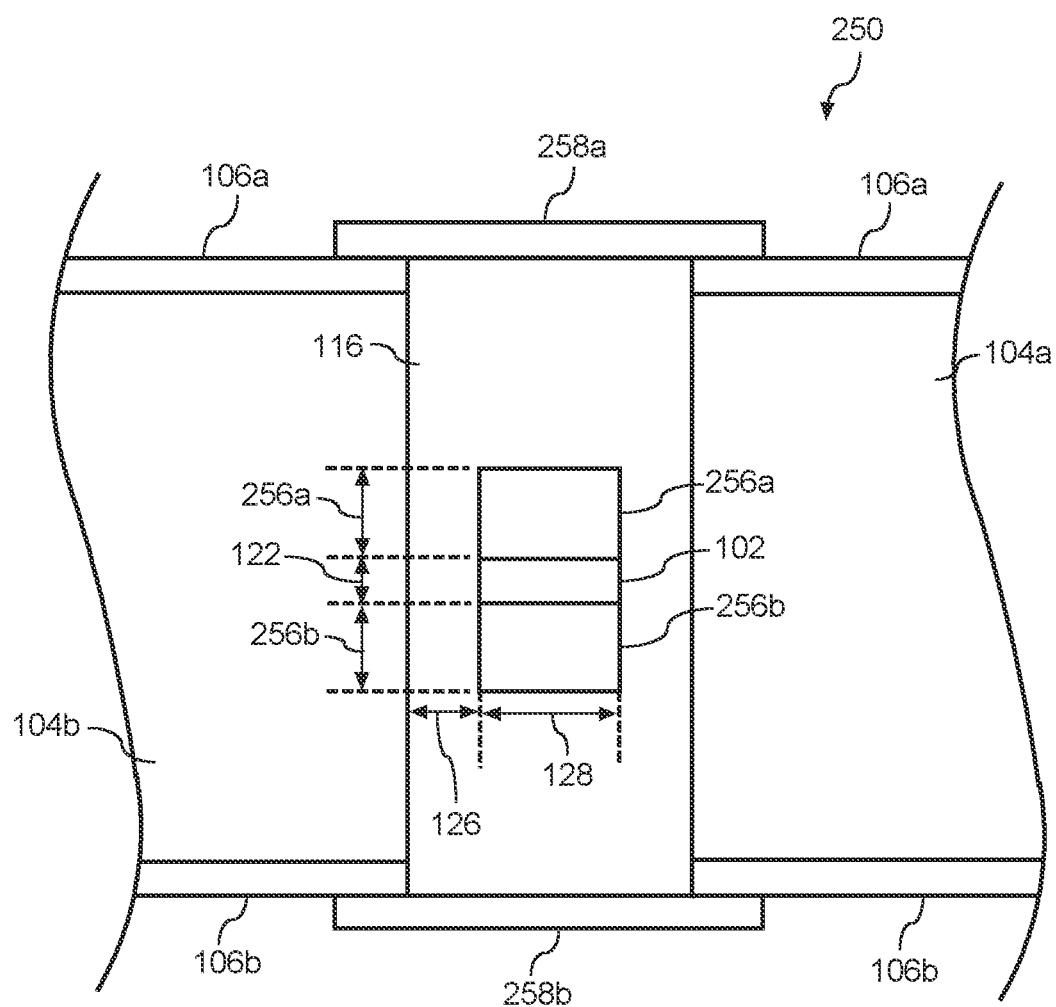
FIG. 9 depicts a cross-sectional view of an example processed laminated circuit assembly according to another example embodiment of the present disclosure.

Although the preceding description has referred to figures which depict material from the substrate 104 being removed from one side of the substrate (e.g., one outer surface), it is contemplated that material can be removed from both sides (e.g., above and below the signal line 102 in the y-direction). For instance, FIG. 9 depicts a circuit assembly 250 having another profile of a filter portion 116. A cavity within the substrate 104 can be formed which divides the substrate 104 into two portions 104a and 104b (at least on the viewing plane depicted; the portions 104a and 104b may, in some embodiments, be connected out of view). The cavity can, in some embodiments, be formed by removing material from both sides of the circuit assembly 250 (e.g., by removing an area of the planar conductor 106a, if present, and/or by removing an area of the planar conductor 106b, if present). In this manner, a substantially symmetric cavity can be formed (e.g., reflectively symmetric about the signal line 102).

Figure 10:
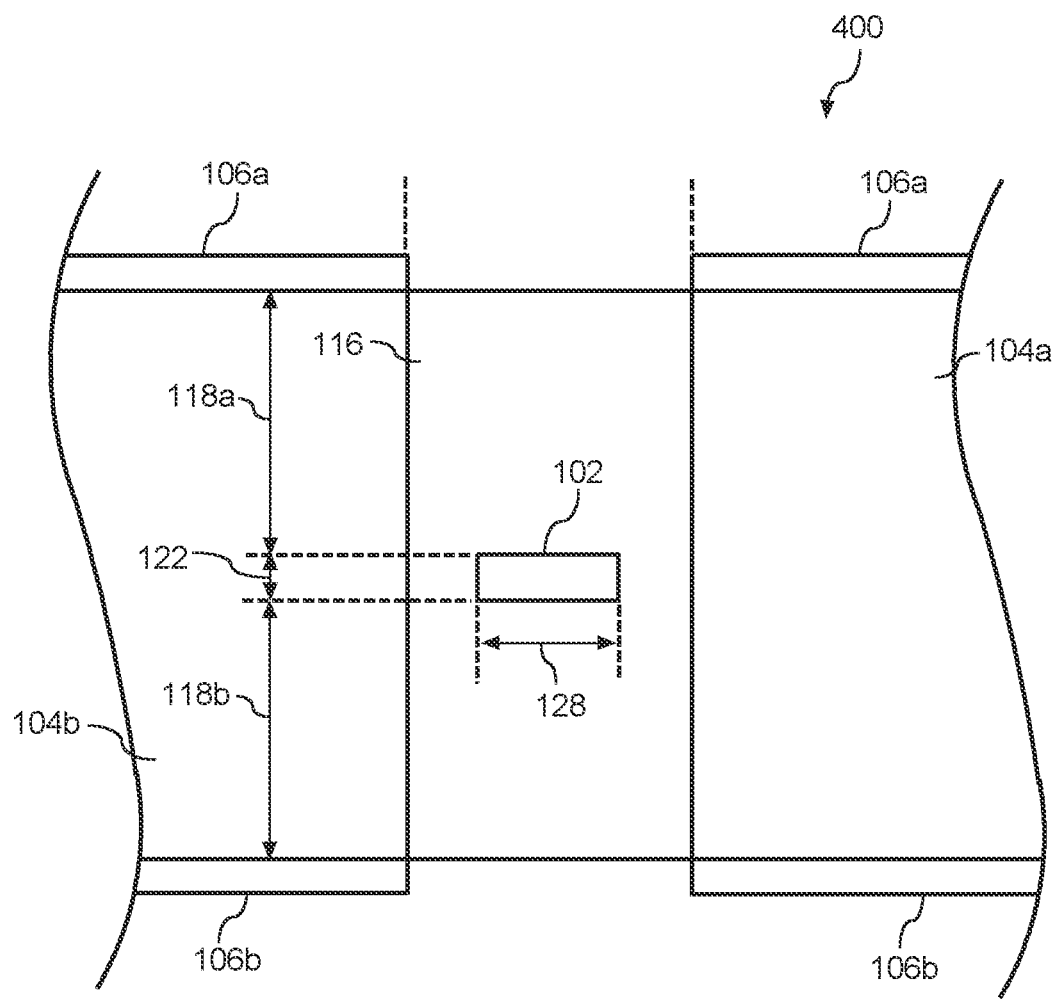
FIG. 10 depicts a cross-sectional view of an example processed laminated circuit assembly according to another example embodiment of the present disclosure.

In some embodiments, the cavity can extend to one or more (e.g., all) surfaces of the signal line 102, such that no substrate material from the substrate 104 remains within the filter portion 116 (e.g., as shown in the circuit assembly 400 of FIG. 10, with the cavity extending depths 118a and 118b to abut the signal line 102). In some embodiments, however, such as shown in FIG. 9, dielectric supports 256a and 256b can be provided (e.g., substrate material not removed). The dielectric supports 256a and 256b can be respectively configured to be the same or different (e.g., support heights 256a and 256b can be the same or different). In this manner, support can be provided for the signal line 102 to support the signal line during subsequent processing (e.g., the filling of the filter portion 116 with filter material, etc.). Dielectric supports 256a and 256b can include a portion of a dielectric not removed during formation of a cavity.

FIG. 9 also depicts covers 258a and 358b which can be used to cover the accesses used to form the cavity within the substrate 104. One or both of the covers 258a and 258b can comprise a conductive material. In one embodiment, the covers 258a and 258b are comprised within a planar conductor 106a and 106b, respectively (e.g., a planar conductor 106a and/or 106b can be laminated to the substrate 104 after formation of the filter portion 116). In some embodiments, another conductor (e.g., another planar conductor) can be applied or laminated over the access(es) to form at least one of the covers 258a and 358b. For instance, a conductive paint or other coating can be applied. The conductive coating can dry and/or cure in place to provide one or both of covers 358a and 358b.

In some embodiments, any one, subset, or all of the communications described above can be communicated via one or more signals traveling along a filtered signal line 102 described herein according to example aspects of the present disclosure. For instance, in one embodiment, a filtered signal line 102 according to example aspects of the present disclosure can be used to communicate qubit interface signals from a control device for controlling and/or reading the behavior of one or more qubits. For example, in one embodiment, the signal line 102 can be used to communicate one or more signals associated with a Pauli X, Y, and/or Z operator.

In one embodiment, a quantum computing system comprises a qubit and a signal line 102 associated with the qubit. The signal line 102 and qubit may be configured and arranged such that, during operation of the quantum computing device, the signal line 102 allows coupling of an XY qubit control flux bias over a first frequency range. The signal line 102 can also provide for the coupling of a Z qubit control flux bias over a second frequency range. In some embodiments, the attenuation of the signal(s) traveling along the signal line 102 can be configured to avoid excess joule heating contributed by excess attenuation of the signals in different frequency ranges. For instance, the filter portion 116 dimensions and/or the filter material can be configured such that the filter portion 116 can include a frequency absorbing material providing less attenuation to signals of a first frequency and greater attenuation to signals of a second, different frequency (e.g., which may be higher or lower). For instance, some filter materials provide attenuation that increases in a substantially monotonic fashion with increasing signal frequency for at least a portion of a targeted frequency band.

In some embodiments, aspects of the filter material can be configured for lowpass and/or bandpass operation. For example, in one embodiment, the filter portion 116 may be configured to attenuate at a first attenuation level in the 0 to 0.5 GHz frequency band and attenuate at a second attenuation level in the 2 to 8 GHz frequency band. While the XY control signals can be operating in the microwave frequency band, in some cases, the Z control signals (which, in some examples, can be higher-power signals than the XY control signals), however, can operate in the 0 to 0.5 GHz band, in some cases. Excessively attenuating the Z qubit control signal may lead to substantial joule heating within the attenuator. The heating, in turn, may increase noise and render it difficult to maintain the low temperature that may be necessary to provide superconducting operation of circuit elements of qubit. For instance, the joule heating may unduly burden or exceed the cooling power of a cryostat or cryostat stage in which the qubit is operating. In some embodiments, the filter portion 116 can be configured to attenuate signals greater than about 10 GHz at a level of attenuation greater than the attenuation provided to the 0 to 0.5 GHz frequency band and the 2 to 8 GHz frequency band, so as to attenuate thermal radiation (e.g., infrared signals) passing through and/or traveling along the signal line.

Figure 11:
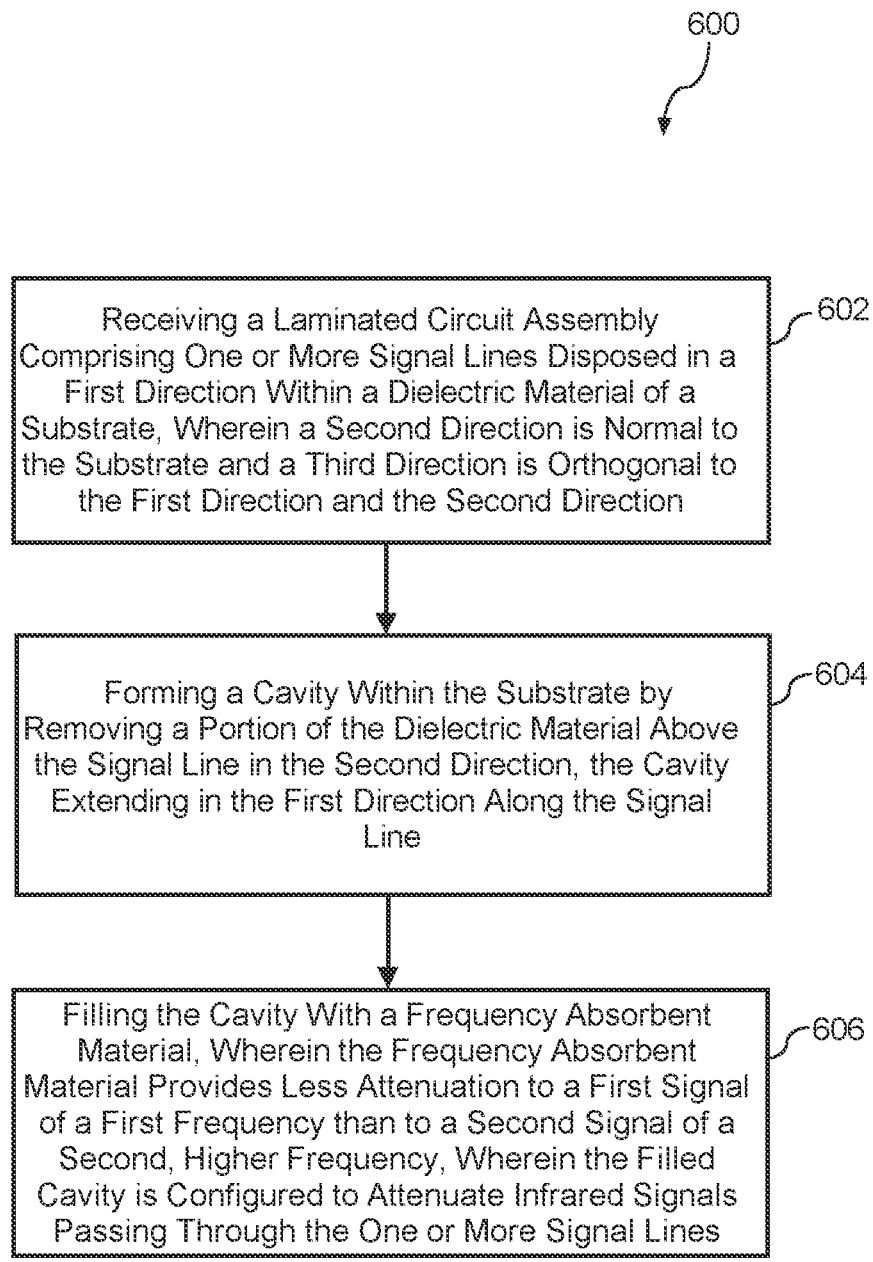
FIG. 11 depicts an example method of manufacturing a laminated circuit assembly according to aspects of example embodiments of the present disclosure.

FIG. 11 depicts a flow chart diagram of an example method 600 according to example embodiments of the present disclosure. FIG. 11 depicts steps performed in a particular order for purposes of illustration and discussion. Those of ordinary skill in the art, using the disclosures provided herein, will understand that various steps of any of the methods disclosed herein can be adapted, modified, performed simultaneously, omitted, include steps not illustrated, rearranged, and/or expanded in various ways without deviating from the scope of the present disclosure.

At 602, the method can include receiving or obtaining a laminated circuit assembly. The laminated circuit assembly can be constructed according to any of the example embodiments disclosed herein. The laminated circuit assembly can include one or more signal lines disposed in a first direction within a dielectric material of a substrate. The laminated circuit assembly can define a second direction normal to the substrate and a third direction that is orthogonal to the first direction and the second direction.

At 604, the method can include forming a cavity within the substrate by removing a portion of the dielectric material above the signal line in the second direction. The cavity can extend in the first direction along the signal line.

At 606, the method can include filling the cavity with a frequency absorbent material. The frequency absorbent material can be configured according to any of the embodiments disclosed herein. The frequency absorbent material can provide less attenuation to a first signal for a first frequency than to a second signal of a second, higher frequency. The filled cavity can be configured to attenuate infrared signals passing through the one or more signal lines.

Additional Disclosure

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A laminated circuit assembly, comprising:
   one or more signal lines disposed within a substrate in a first direction;
   a dielectric portion of the substrate; and
   a filter portion of the substrate extending in the first direction and containing a frequency absorbent material providing less attenuation to a first signal of a first frequency than to a second signal of a second, higher frequency;
   wherein the filter portion is configured to attenuate infrared signals passing through the one or more signal lines, and
   wherein the filter portion comprises boundaries defined by a cavity formed within the dielectric portion, wherein the cavity exposes at least one portion of the one or more signal lines, and wherein the cavity is at least partially filled with the frequency absorbent material such that the frequency absorbent material is in physical contact with the at least one portion of the one or more signal lines.

2. The laminated circuit assembly of claim 1, wherein:
   the one or more signal lines are configured to transmit control signals from a classical computing device to a quantum hardware.

3. The laminated circuit assembly of claim 1, wherein the dielectric portion is formed of a polymer, and wherein the filter portion comprises frequency absorbing particles embedded within the polymer.

4. The laminated circuit assembly of claim 1, wherein the dielectric portion is formed of a first polymer, and wherein the frequency absorbent material comprises frequency absorbing particles embedded within a second polymer that is different than the first polymer.

5. The laminated circuit assembly of claim 1, wherein:
   a second direction is normal to the substrate and a third direction is orthogonal to the first direction and the second direction; and
   a first portion of the cavity is located above the signal line along the second direction, and a second portion of the cavity is located beside the signal line along the third direction.

6. The laminated circuit assembly of claim 5, wherein the first portion of the cavity extends from an outer surface of the substrate to the signal line.

7. The laminated circuit assembly of claim 5, comprising:
   a dielectric support supporting the signal line, the dielectric support comprising a portion of the dielectric within which the cavity is formed;
   wherein a third portion of the cavity is located below the signal line along the second direction.

8. The laminated circuit assembly of claim 5, comprising:
   a first conductive layer laminated to an outer surface of the substrate, the first conductive layer comprising an access for the filling of the cavity with the frequency absorbent material; and
   a second conductive layer covering the access.

9. The laminated circuit assembly of claim 8, wherein the second conductive layer comprises a curable nonmetallic matrix.

10. The laminated circuit assembly of claim 1, wherein the second polymer is a curable polymer, the cavity having been at least partially filled with the frequency absorbent material with the second polymer in an uncured state.

11. The laminated circuit assembly of claim 1, wherein the one or more signal lines comprise:
    a first signal line having a first filter portion corresponding thereto; and
    a second adjacent signal line having a second filter portion corresponding thereto;
    wherein the first filter portion and the second filter portion are offset from each other in the first direction.

12. The laminated circuit assembly of claim 1, wherein the filter portion is configured to attenuate signals in at least one of the one or more signal lines by at least about 0.5 dB/GHz.

13. The laminated circuit assembly of claim 1, wherein the cavity is formed by ablation of the dielectric.

14. The laminated circuit assembly of claim 1, wherein the first frequency is less than about 500 MHz and the second frequency is greater than about 2 GHz and less than about 8 GHz, and wherein frequency absorbent material provides greater attenuation to the infrared signals than to either of the first signal or the second signal.

15. A method for manufacturing a filter for a signal line, comprising receiving a laminated circuit assembly comprising one or more signal lines disposed in a first direction within a dielectric material of a substrate, wherein a second direction is normal to the substrate and a third direction is orthogonal to the first direction and the second direction;
    forming a cavity within the substrate by removing a portion of the dielectric material above the signal line in the second direction, the cavity extending in the first direction along the signal line, wherein the cavity exposes at least one portion of the one or more signal lines; and filling the cavity with a frequency absorbent material such that the frequency absorbent material is in physical contact with the at least one portion of the one or more signal lines, wherein the frequency absorbent material provides less attenuation to a first signal of a first frequency than to a second signal of a second, higher frequency, wherein the filled cavity is configured to attenuate infrared signals passing through the one or more signal lines.

16. The method of claim 15, wherein the cavity is formed by ablation of the dielectric material.

17. The method of claim 15, further comprising:
laminating a conductive layer to an outer surface of the substrate, the conductive layer covering an access for the filling of the cavity with the frequency absorbent material.

18. A cryogenic cooling system, comprising:
a plurality of cooling stages configured to cool a cooled portion of a computing system to a temperature of less than about 3 Kelvin;
one or more signal lines coupling a control unit to the cooled portion of the computing system; and
a laminated circuit assembly, comprising:
 one or more signal lines disposed within a substrate in a first direction;
 a dielectric portion of the substrate; and
 a filter portion of the substrate extending in the first direction and containing a frequency absorbent material providing less attenuation to a first signal of a first frequency than to a second signal of a second, higher frequency;
 wherein the filter portion is configured to attenuate infrared signals passing through the one or more signal lines, and
wherein the filter portion comprises boundaries defined by a cavity formed within the dielectric portion, wherein the cavity exposes at least one portion of the one or more signal lines, and wherein the cavity is at least partially filled with the frequency absorbent material such that the frequency absorbent material is in physical contact with the at least one portion of the one or more signal lines.

19. The cryogenic cooling system of claim 18, wherein one or more of the plurality of cooling stages is configured to providing cooling to a temperature of less than about 20 milliKelvin and comprises the laminated circuit assembly.

* * * * *